United States Patent [19]

Kalaf

[11] Patent Number: 5,164,620
[45] Date of Patent: Nov. 17, 1992

[54] AUTONOMOUS GAIN NORMALIZATION CIRCUIT

[76] Inventor: Thomas R. Kalaf, 13 Primrose, Irvine, Calif. 92714

[21] Appl. No.: 798,535

[22] Filed: Nov. 26, 1991

[51] Int. Cl.$^5$ .................... H03K 5/153; G06G 7/12
[52] U.S. Cl. ................................. 307/493; 307/359; 307/264
[58] Field of Search ............... 307/493, 353, 264, 311, 307/359; 341/172, 163, 139

[56] References Cited

U.S. PATENT DOCUMENTS

| | | | |
|---|---|---|---|
| 4,633,086 | 12/1986 | Parrish | 250/338 |
| 4,694,208 | 9/1987 | Szabó et al. | 307/595 |
| 4,785,253 | 11/1988 | Hughes | 307/521 |
| 4,786,831 | 11/1988 | Morse et al. | 307/490 |
| 4,804,863 | 2/1989 | Welland et al. | 307/227 |
| 4,894,791 | 1/1990 | Jiang et al. | 307/597 |
| 4,914,319 | 4/1990 | Hashimoto | 307/353 |
| 5,039,879 | 8/1991 | Parrish | 307/493 |

*Primary Examiner*—William L. Sikes
*Assistant Examiner*—Toan Tran
*Attorney, Agent, or Firm*—Stetina and Brunda

[57] ABSTRACT

An autonomous gain normalization circuit has a fixed capacitor for receiving a current signal such as that output by an infrared detector element and a plurality of switchable capacitors connectable in parallel with the fixed capacitor. The first switchable capacitor preferably has a capacitance of approximately one half of that of the fixed capacitor and each successive capacitor preferably has a capacitance of approximately one half that of the preceding capacitor. An analog-to-digital converter converts the voltage stored upon the capacitors into a first digital word. During a normalization cycle, the most significant bits of the first digital word cause connection of the switchable capacitors in parallel with the fixed capacitors such that second digital word having a value within a desired range is then provided by the analog-to-digital converter. Thus, the outputs of a plurality of such autonomous gain normalization circuits are normalized to a common range of values to facilitate signal processing thereupon.

18 Claims, 2 Drawing Sheets

AUTONOMOUS GAIN NORMALIZATION CIRCUIT

FIELD OF THE INVENTION

The present invention relates generally to electronic signal processing and more particularly to an autonomous gain normalization circuit for normalizing gains among analog signal channels in an infrared detection system.

BACKGROUND OF THE INVENTION

Current infrared detector systems incorporate arrays of large numbers of discrete, highly sensitive detector elements, the outputs of which are connectable to sophisticated processing circuitry. By rapidly analyzing the pattern and sequence of detector element excitations, the processing circuitry can identify and monitor sources of infrared radiation. A contemporary subarray of detectors may contain 256 detectors on a side, or a total of 65,536 detectors. The size of each square detector is approximately 0.009 cm on a side with 0.00127 cm spacing between detectors. Such a subarray would therefore be 2.601 cm on a side. The subarray may, in turn, be joined to form an array that connects twenty-five million or more detectors. Considerable difficulties are presented in normalizing the output of each detector.

The response of an infrared detector and its associated electronic processing channel is linear with an output measured in volts per watt of absorbed infrared radiation. A DC offset is associated with each detector and signal processing channel and is defined as fixed pattern noise. The detector response and DC offset are unique for each channel, i.e. they are different for each channel but fall within a given range of values. Satisfactory methods exist to eliminate fixed pattern noise, however the removal of variations in channel response, or gain among elements within an array is typically accomplished with a separate specialized computer.

Gain normalization to a high level is required by the sophisticated algorithms which analyze the detector array outputs. The variation in gain from one detector channel to another increases the dynamic range requirements for the output amplifier when detector channels are multiplexed into a common output amplifier. The dynamic range of the analog to-digital converter and the signal processing hardware must likewise have sufficient dynamic range to handle the multiplexed data.

Increasing the dynamic range requirements of the output amplifier, analog-to-digital converter, and signal processing hardware results in an increase in system weight and cost. Therefore, it is desirable to maintain the best possible uniformity in gain among all detector channels. Gain normalization commonly consists of multiplication of the signal by a correction factor after analog-to-digital conversion. This is commonly accomplished with a separate specialized computer which is required to have sufficient memory to store a correction factor for each channel and must also have dedicated multiplication hardware. The memory and power requirements become severe for a five million or more element detector array.

The use of such a specialized computer to perform gain normalization also increases the size and weight of the detector system. This is particularly crucial in spacecraft applications where weight, volume, and power considerations are paramount. As such, although the prior art has recognized the need for gain normalization for infrared detector arrays, the proposed solutions have to date been ineffective in providing a satisfactory remedy.

SUMMARY OF THE INVENTION

The present invention specifically addresses and alleviates the above mentioned deficiencies associated in the prior art. More particularly, the present invention comprises an autonomous gain normalization circuit having a fixed capacitor for receiving a current signal such as that output by an infrared detector element and a plurality of switchable capacitors connectable in parallel with said fixed capacitor. The first switchable capacitor preferably has a capacitance of approximately one half of that of the fixed capacitor and each successive switched capacitor preferably has a capacitance of approximately one half that of the preceding capacitor.

An analog-to-digital converter converts the voltage stored upon the capacitors into a first digital word. During a normalization cycle, the most significant bits of the first digital word cause connection of the switchable capacitors in parallel with the fixed capacitors such that a second digital word having a value within a desired range is provided by the analog-to-digital converter. The switchable capacitors are connected in parallel in direct response to the first digital word via a feedback circuit, rather than being controlled by a computer which operates in response to the first digital word. As used herein, "direct response" means without the utilization of such a computer. In its simplest form, the feedback circuit is nothing more than the straight connection of the analog-to-digital converter outputs to switches which effect connection of the capacitors in parallel. No intermmediate components are necessary. Thus, use of the autonomous gain normalization circuit of the present invention facilitates control of the normalization process without the intervention of a specialized computer.

Those skilled in the art will recognize that various components, e.g. latches, switches, etc., may nevertheless be required intermediate the analog-to-digital converter and the capacitor switches to effect such switching. The use of such direct connection of the switchable capacitor to the analog-to-digital converter eliminates the need for memories, lookup tables, and the like, essential in the use of a computer to effect switching of the capacitor.

Thus, the outputs of a plurality of such autonomous gain normalization circuits are normalized to a common range of values to facilitate signal processing thereupon. These, as well as other advantages of the present invention will be more apparent from the following description and drawings. It is understood that changes in the specific structure shown and described may be made within the scope of the claims without departing from the spirit of the invention.

DETAILED DESCRIPTION OF THE PREFERRED EMBODIMENT

The detailed description set forth below in connection with the appended drawings is intended as a description of the presently preferred embodiment of the invention, and is not intended to represent the only form in which the present invention may be constructed or utilized. The description sets forth the functions and sequence of steps for construction and implementation of the invention in connection with the illustrated embodiment. It is to be understood, however, that the same or equivalent functions and sequences may be accomplished by different embodiments that are also intended to be encompassed within the spirit and scope of the invention.

Figure 1:
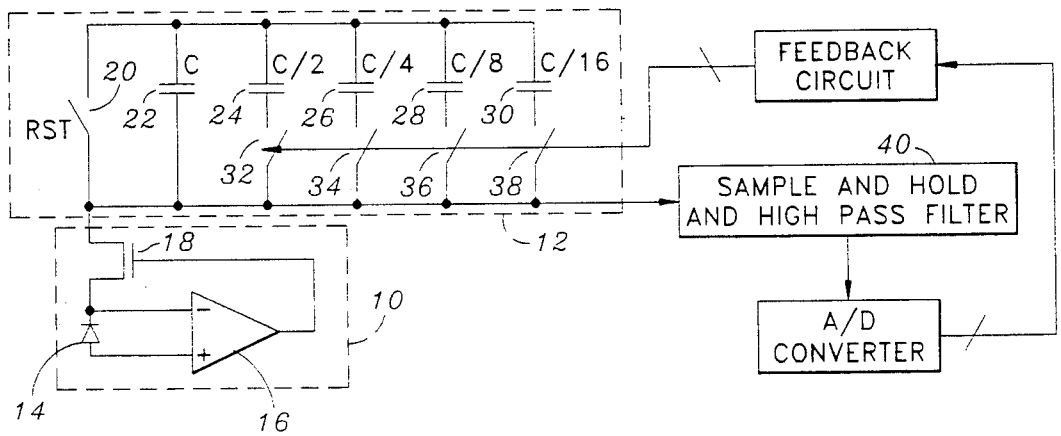
FIG. 1 is a schematic representation of a detector input circuit connected to a transimpedance amplifier according to the present invention.
Figure 2:
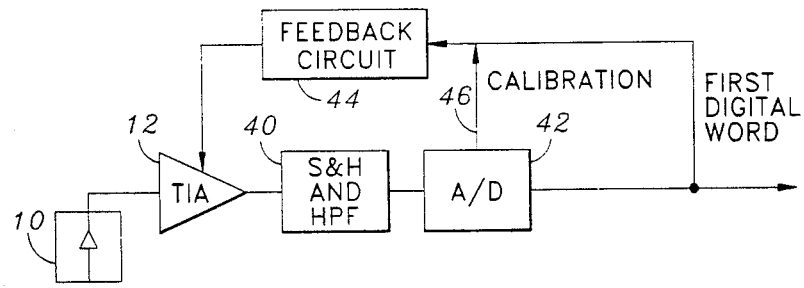
FIG. 2 is a schematic block diagram of the autonomous gain normalization circuit of the present invention.
Figure 3:
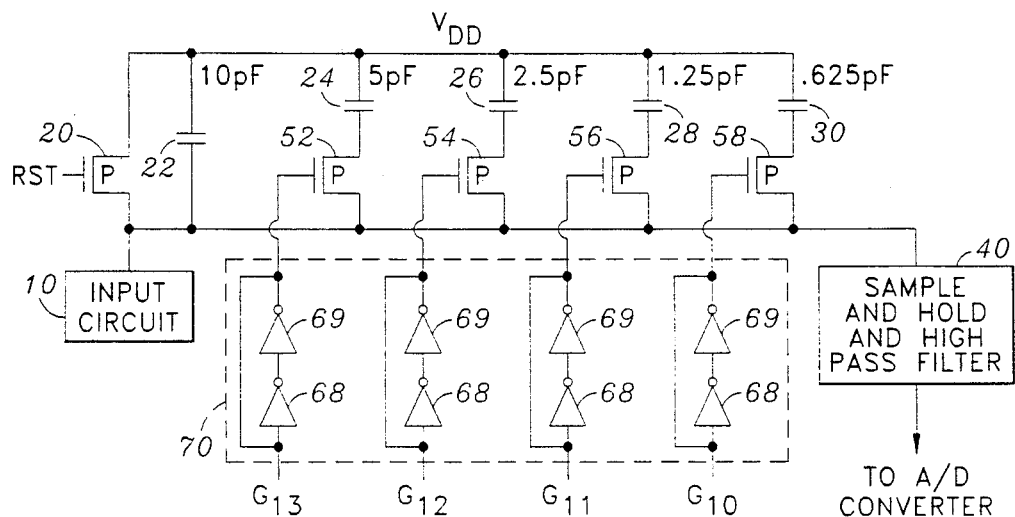
FIG. 3 is a schematic representation of a transimpedance amplifier according to the present invention, also depicting the latching circuit.
Figure 4:
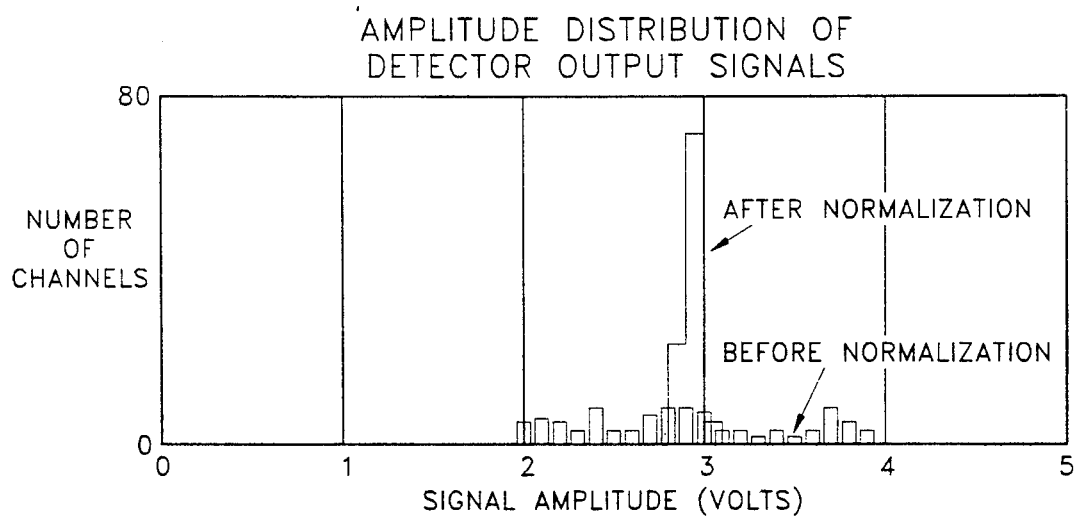
FIG. 4 is a histogram depicting the distribution of channels according to the value of their current output about the mean output value.

The autonomous gain normalization circuit of the present invention is illustrated in FIGS. 1-3 which depict a presently preferred embodiment of the invention. FIG. 4 depicts a histogram illustrating the distribution of the value of detector output signals before and after normalization to show the effect of the present invention.

Referring now to FIG. 1, a detector input circuit 10 is comprised of an infrared detector element 14 connected to an amplifier 16, the output of which is applied to the gate of a field effect transistor 18. The input circuit maintains a zero bias condition upon the infrared detector element 14 to reduce 1/f noise and enhance the signal-to-noise ratio of the circuit as discussed in U.S. Pat. No. 4,633,086 to PARRISH, the contents of which are hereby incorporated by reference.

The output of the input circuit 10 is provided to a transimpedance amplifier 12 which comprises a reset switch 20, a fixed capacitor 22 and a plurality of switchable capacitors 24-30 connectable in parallel with the fixed capacitor 22 via switches 32-38, which preferably comprise transistors. A current signal is provided by the input circuit 10 and forms a voltage representative of the current output from the detector input circuit 10 over an integration period as described in U.S. Pat. No. 5,039,879, issued on Aug. 13, 1991, the contents of which are hereby incorporated by reference.

The value of the capacitance of the first switched capacitor 24 is approximately one half that of the value of the capacitance of the fixed capacitor 22. The value of each successive capacitor 26-30 is likewise approximately one half that of the preceding capacitor 24-28. Adding any of the switched capacitors 24-30 in parallel with the fixed capacitor 22 increases the amount of current output by the input circuit 10 which is required to provide a given output voltage of the transimpedance amplifier 12. Thus, connecting the switchable capacitors 24-30 in parallel with the fixed capacitor 22 reduces the gain of the transimpedance amplifier 12 by an amount proportional to the ratio of switched capacitor 24-30 to the fixed capacitor 22. Thus, the output of the transimpedance amplifier 12 may be varied to provide a normalized detector input circuit 10 output wherein the voltage output of the transimpedance amplifier 12 has a value within a desired range. The voltage output of the transimpedance amplifier 12 is provided to a sample and hold and a high pass filter 40 from which it is communicated to an analog-to-digital converter.

The sample-and-hold circuit of the ample-and-hold and high pass filter 40 temporarily captures a signal representative of the output of the infrared detector element 14 such that analog-to-digital conversion ay be performed thereon. The sample-and-hold circuit of the sample-and-hold and high pass filter 40 preferably comprises a capacitor upon which a voltage representative of the output signal 14, integrated over a desired period of time, is stored such that the analog-to-digital converter may determine the value thereof.

Referring now to FIG. 2, a block diagram of the autonomous gain normalization circuit of the present invention is provided. The input circuit 10 provides a current output signal which is then input into the transimpedance amplifier 12 containing the fixed capacitor 22 and the switchable capacitors 24-30 (as shown in FIG. 1). The voltage output of the transimpedance amplifier 12 is provided to the sample and hold and high pass filter 40 where the high frequency component of the voltage fluctuations is removed. The filtered output of the sample and hold high pass filer 40 is provided to the analog-to-digital converter 42 which converts the analog voltage signal into a corresponding digital word.

The feedback circuit 44 is operative to effect connection of selected capacitors 24-30 in parallel with the fixed capacitor 22 in direct response to the value of the digital output word. Those skilled in the art will recognize that various circuits are possible for effecting such switching in direct response to the state of individual bits contained within the digital output word.

Referring now to FIG. 3, the switches 32-38 of FIG. 1 preferably comprises transistors 52-58 and are preferably maintained in a desired state by latches 70. The desired state depends upon the value of the most significant bits of the output word of the analog-to-digital converter 42. Each latch 70 is comprised of first 68 and second 69 invertors configured in a feedback loop to hold the input states stable until reset.

Operation of the autonomous gain normalization circuit of the present invention can be conveniently separated into two cycles, the first cycle being the normalization cycle and the second cycle being the operational cycle. During the normalization cycle the output or first digital word of the analog-to-digital converter 42 is provided through a feedback circuit 44 to the transimpedance amplifier 12 to affect the connection of selected switched capacitors 24-30 in parallel with the fixed capacitor 22 to provide normalization of the detector input signal. Higher detector input signals, resulting in larger analog-to-digital 42 outputs, cause more capacitance to be placed in parallel with the fixed capacitor 22.

In the second or operative mode, the switch capacitors 24-30 of the transimpedance amplifier 12 have been connected in parallel to the fixed capacitor 22 such that a second digital output word of the analog-to-digital converter 42 is within a desired range of values. Thus, normalized values for the second digital output words are provided to signal conditioning electronics. The autonomous gain normalization circuit may be operated in the second or operative mode until normalization is again desired.

The infeared detector element 14 provide a continuous output through the transimpedance amplifier 12 and the sample-and-hold and high pass filter 40 to the analog-to-digital converter 42. Thus, a second input signal is supplied to the analog-to-digital converter 42. It is this second input signal which results in the generation of the second digital output word from the analog-to-digital converter 42.

Normalization results from the splitting of the output signal from the infared detector element 14 between the transimpedance ;amplifier 12 and the sample-and-hold 40. The amount of such splitting is proportional to the relative capacitances of the transimpedance amplifier 12 and the sample-and-hold 40, the greater the amount of signal diverted to or stored upon the capacitors of the transimpedance amplifier 12 as compared of the sample-and-hold 40 and thus, the lower the value of the resulting second digital output word of the analog-to-digital converter 42.

The normalization process thus comprises digitizing a first output signal from the infrared detector element 14 and utilizing that digitized woe to effect normalization of subsequent output signals from the infrared detector element 14. Such subsequent output signals from the infared detector element 14 provide valid digital data as long as they remain within a desired range of values. When the level of the output signals from the infrared detector element 14 varies from the desired range of values, then the normalization process must be repeated.

A calibration signal 46 may be output from the analog to-digital converter 42 to the feedback circuit 44 to provide for calibration and testing of the transimpedance amplifier 12, sample and hold, and high pass filter 40, and the analog-to-digital converter 42. By providing a known calibration signal 46 to the feedback circuit 44, the performance of the transimpedance amplifier 12, the sample and hold, and high pass filter 40, and the analog-to-digital converter 42 may be evaluated and the circuitry adjusted as required to compensate for any electronic idiosyncrasies.

As an illustrative example, if we assume a 15 bit output word from the analog-to-digital converter 42, the most significant bit $G_{14}$ of the output word may be utilized to indicate that the detector output signal is within an acceptable range, i.e. the analog to-digital converter has not saturated and the signal is of sufficient amplitude to be useful. The next four most significant bits $G_{10}-G_{13}$ of the digital output word may then define the switched capacitors 24-30 to be connected in parallel with the fixed capacitor 22. The most significant $G_{13}$ of these four bits $G_1-G_{13}$ being operative to connect the highest value of the four capacitors, i.e. capacitor 24, in parallel with the fixed capacitor 22 and each of the more significant remaining three bits being operative place each of the higher capacitance capacitors 26-30 likewise in parallel with the fixed capacitor 22.

Thus, the higher the value of the first digital output word, the greater the amount of capacitance placed in parallel with the fixed capacitor 22 and consequently the lower the gain of the transimpedance amplifier 12. Thus, the autonomous gain normalization circuit of the present invention tends to normalize the output of the detector input circuit 10 such that it is within a desired range of values. Use of a plurality of such gain normalization circuits consequently tend to group the outputs of a plurality of detector input circuits within the desired range to minimize the required dynamic range of the signal conditioning circuitry. That is, detector input circuits 10 having a wide range of outputs for a single given infrared input may be brought to within a narrow range of values through use of the autonomous gain normalization circuit of the present invention such that they may be multiplexed to a single set of signal conditioning electronics having a more limited dynamic range.

Referring now to FIG. 4, a histogram showing the distribution of a plurality of detector input channels before and after normalization is provided. As can be seen, before normalization the channels are spread in amplitude between two and four volts with a mean of approximately three volts. However, after normalization the range of signal amplitudes has narrowed considerably. The histogram was generated utilizing mathematical modeling of signals varying by as much as $\pm 33\%$ from a nominal value. After normalization, 97% of the channels are within 2.5% of the mean. Thus, it can be seen that normalization narrows the range of amplitudes such that the dynamic range of any signal conditioning electronics operating upon these signals is reduced considerably.

It is understood that the exemplary autonomous gain normalization circuit described herein and shown in the drawings represents only a presently preferred embodiment of the invention. Indeed, various modifications and additions may be made to such embodiment without departing from the spirit and scope of the invention. For example, the autonomous gain normalization circuit of the present invention may be operative to normalize the gain of various input signals, i.e. those generated by microphones, temperature sensors, strain sensors, etc. Indeed, the autonomous gain normalization circuit of the present invention may be operative to normalize the gain of any transducer or circuit having a current output which may be integrated to provide a voltage representative of the current output. Thus, these and other modifications and additions may be obvious to those skilled in the art and may be implemented to adapt the present invention for use in a variety of different applications.

What is claimed is:

1. An autonomous gain normalization circuit comprising:
   (a) a plurality of capacitors, electrically connectable in parallel, for receiving first and second input current signals at a common terminal thereof, the second input current signal being received subsequent o the first input current signal;
   (b) a sample and hold circuit coupled to said capacitors for subsequently and respectively storing voltages representative of the first and second input current signals, the voltages having a high frequency component;
   (c) an analog-to-digital converter coupled to said sample and hold circuit for generating respectively first and second digital words representative to the voltages stored in said sample and hold circuit in response to the first and second input current signals; and
   (d) a feedback circuit for connecting selected ones of said capacitors in parallel in direct response to the first digital word such that the second input current signal causes the second digital word to subsequently be generated within a desired range by said analog-to-digital converter;
   (e) wherein said second digital word is representative of the second current signal after being normalized.

2. The autonomous gain normalization circuit as recited in claim 1 wherein predetermined its of the first digital word effect connection of corresponding capacitors in parallel.

3. The autonomous gain normalization circuit as recited in claim 1 wherein substantially most significant bits of the first digital word effect connection of corresponding capacitors in parallel.

4. The autonomous gain normalization circuit as recited in claim 1 wherein:
   (a) the first digital word comprises a fifteen bit word;
   (b) the most significant bit indicates whether the voltage stored upon said capacitor is within a desired range; and
   (c) the next four most significant bits effect connection of corresponding capacitors in parallel.

5. The autonomous gain normalization circuit as recited in claim 4 wherein the most significant bit of the first digital word indicates whether the voltage stored upon said capacitors is within 33% of a desired voltage.

6. The autonomous gain normalization circuit as recited in claim 1 wherein said plurality of capacitors comprise:
   (a) one fixed capacitor, said fixed capacitor receiving said first and second input current signals and being in electrical communication with said analog-to-digital converter regardless of the value of the first digital word; and
   (b) a plurality of switchable capacitors, said switchable capacitors being switchably connectable in parallel to said first capacitor in response to the state of corresponding bits of the first digital word.

7. The autonomous gain normalization circuit as recited in claim 6 wherein a first of said switched capacitors has a capacitance of approximately half of that of said fixed capacitor and wherein each successive switched capacitor has a capacitance of approximately half of that of the preceding capacitor.

8. The autonomous gain normalization circuit as recited in claim 1 further comprising a high pass filter in electrical communication with said plurality of capacitors and said analog-to-digital filters for removing a substantial portion of a high frequency component of a capacitor output signal output by said capacitors.

9. The autonomous gain normalization circuit as recited in claim 1 wherein said feedback circuit consists only of conductive conduits electrically connecting said analog-to-digital converter to switches, said switches connecting said capacitors in parallel.

10. An autonomous gain normalization circuit comprisign:
    (a) a fixed capacitor for receiving first and second input current signals at a common terminal thereof, the second input current signal being received subsequent to the first input current signal;
    (b) a plurality of switched capacitors connectable in parallel with said fixed capacitor, the first of said switched capacitors having a capacitance of approximately half that of each proceeding capacitor;
    (c) a sample and hold circuit coupled to said fixed capacitor and said switched capacitors for subsequently and respectively storing voltages representative of the first and second input current signals;
    (d) an analog-to-digital converter coupled to said sample and hold circuit for providing a first digital word representative of the voltage stored upon said sample and hold circuit; and
    (e) a feedback circuit responsive to substantially most significant bits of the first digital word for connecting selected ones of said switched capacitors in parallel with said fixed capacitor in direct response o the first digital word such that the second input signal causes a second digital word to be subsequently provided by said analog-to-digital converter, the second digital word having a value within a desired range;
    (f) wherein said second digital word is representative of the second current signal after being normalized.

11. A method for autonomous gain normalization, said method comprising the steps of:
    (a) providing a first input current signal to a first terminal of plurality of capacitors, said capacitors electrically connectable in parallel such that a voltage representative of the first input current signal may be stored thereupon, said voltage defining a capacitor output signal;
    (b) sampling and holding the capacitor output signal;
    (c) performing analog-to-digital conversion with an analog-to-digital converter upon the sample and hold capacitor output signal to provide a first digital word representative of the voltage stored upon said capacitors; and
    (d) connecting selected ones of said capacitors in parallel in direct response to the first digital word such that a second input current signal subsequently applied to the first terminal thereof causes the analog-to-digital counter to generate a second digital word having a value within a desire range;
    (e) wherein said second digital word is representative of the second current signal after being normalized.

12. The method as recited in claim 11 wherein the step of connecting selected ones of said capacitors in parallel in response to the first digital word comprises connecting selected ones of said capacitors in parallel in response to predetermined bits of the first digital word.

13. The method as recited in claim 12 wherein the step of connecting selected ones of said capacitors in parallel in response to the first digital word comprises connecting selected ones of said capacitors in parallel in response to substantially most significant bits of the first digital word.

14. The method as recited in claim 12 wherein the step of performing analog-to-digital conversation upon the capacitors output to provide a first digital word comprises performing analog-to-digital conversion upon the capacitor output to generate a fifteen bit word wherein:
    (a) the most significant bit indicates whether the voltage stored upon said capacitor is within a desired range; and
    (b) the next four most significant bits effect connection of corresponding capacitors in parallel.

15. The method as recited in claim 14 wherein the step of performing analog-to-digital conversion upon the capacitor output to provide a first digital word comprises performing analog-to-digital conversion upon the capacitor output to provide a first digital word, the most significant bit of the first digital word indicating whether the voltage stored upon said capacitors is within 33% of a desired voltage.

16. The method as recited in claim 11 wherein the step of providing a current signal to a plurality of capacitors comprises providing a current signal to a fixed capacitor and a plurality of switched capacitors, said switched capacitors being switchably connectable in parallel to said first capacitor in response to the state of corresponding bits of the first digital word.

17. The method as recited in claim 11 wherein the step of providing a current signal to a plurality of capacitors comprises providing a current signal to a fixed capacitor, a first switched capacitor, and a plurality of successive switched capacitors, said first switched capacitor having a capacitance of approximately half of that of said fixed capacitor and each successive switched capacitor has a capacitance of approximately half of that of the preceding successive switched capacitor.

18. The method as recited in claim 11 wherein the step of connecting selected ones of said capacitors in parallel comprises connecting selected ones of said capacitors in parallel via only conductive conduits.

* * * * *